United States Patent
Chen et al.

(10) Patent No.: US 12,277,993 B2
(45) Date of Patent: *Apr. 15, 2025

(54) PAGE BUFFER CIRCUITS IN THREE-DIMENSIONAL MEMORY DEVICES

(71) Applicant: YANGTZE MEMORY TECHNOLOGIES CO., LTD., Wuhan (CN)

(72) Inventors: Teng Chen, Wuhan (CN); Yan Wang, Wuhan (CN); Masao Kuriyama, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/420,023

(22) Filed: Jan. 23, 2024

(65) Prior Publication Data
US 2024/0161789 A1    May 16, 2024

Related U.S. Application Data

(63) Continuation of application No. 17/687,264, filed on Mar. 4, 2022, now Pat. No. 11,935,619, which is a continuation of application No. PCT/CN2021/102987, filed on Jun. 29, 2021.

(51) Int. Cl.
*G11C 7/10*    (2006.01)
*G11C 7/12*    (2006.01)
*G11C 7/18*    (2006.01)

(52) U.S. Cl.
CPC .......... *G11C 7/1048* (2013.01); *G11C 7/1039* (2013.01); *G11C 7/12* (2013.01); *G11C 7/18* (2013.01)

(58) Field of Classification Search
None
See application file for complete search history.

(56) References Cited

U.S. PATENT DOCUMENTS

| | | |
|---|---|---|
| 8,395,940 B2 | 3/2013 | Huh |
| 10,395,741 B2 | 8/2019 | Park et al. |
| 10,460,813 B2 | 10/2019 | Park |
| 11,636,898 B2 | 4/2023 | Ko et al. |

(Continued)

FOREIGN PATENT DOCUMENTS

| | | |
|---|---|---|
| CN | 108091365 A | 5/2018 |
| CN | 112037839 A | 12/2020 |

(Continued)

OTHER PUBLICATIONS

International Search Report issued in corresponding International Application No. PCT/CN2021/102987, mailed Mar. 30, 2022, 5 pages.

(Continued)

*Primary Examiner* — Tan T. Nguyen
(74) *Attorney, Agent, or Firm* — BAYES PLLC

(57) ABSTRACT

A page buffer circuit of a memory device includes a first sensing branch including a first pre-charge path and a low-voltage latch, and a second sensing branch including a second pre-charge path and a sensing latch. The first sensing branch and the second sensing branch are parallel coupled to a sensing node of the page buffer circuit.

20 Claims, 11 Drawing Sheets

(56) References Cited

U.S. PATENT DOCUMENTS

| | | | |
|---|---|---|---|
| 11,935,619 B2* | 3/2024 | Chen | G11C 16/10 |
| 2009/0175081 A1 | 7/2009 | Kim | |
| 2010/0195402 A1 | 8/2010 | Park | |
| 2018/0144800 A1 | 5/2018 | Park | |
| 2018/0322929 A1 | 11/2018 | Park et al. | |
| 2020/0135758 A1 | 4/2020 | Park et al. | |
| 2020/0258577 A1* | 8/2020 | Lee | G11C 16/24 |
| 2020/0381055 A1 | 12/2020 | Ko | |
| 2021/0005268 A1 | 1/2021 | Kim et al. | |
| 2021/0050049 A1 | 2/2021 | Baek et al. | |
| 2021/0391000 A1* | 12/2021 | Lee | G11C 16/0483 |
| 2022/0028469 A1 | 1/2022 | Hsu | |
| 2022/0284933 A1 | 9/2022 | Park et al. | |
| 2022/0336040 A1 | 10/2022 | Lee | |
| 2022/0415372 A1 | 12/2022 | Chen | |

FOREIGN PATENT DOCUMENTS

| | | |
|---|---|---|
| CN | 112689874 A | 4/2021 |
| JP | 2012-133834 A | 7/2012 |
| KR | 20100131709 A | 12/2010 |

OTHER PUBLICATIONS

Office Action mailed Sep. 14, 2023, in U.S. Appl. No. 17/686,860, Chen et al., filed Mar. 4, 2022, 22 pages.

* cited by examiner

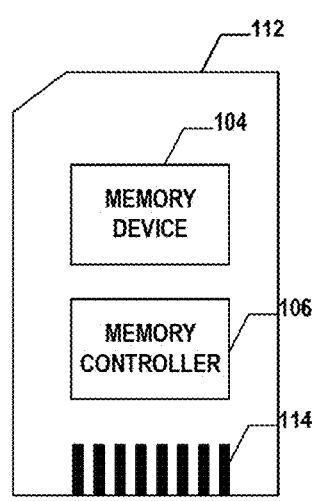
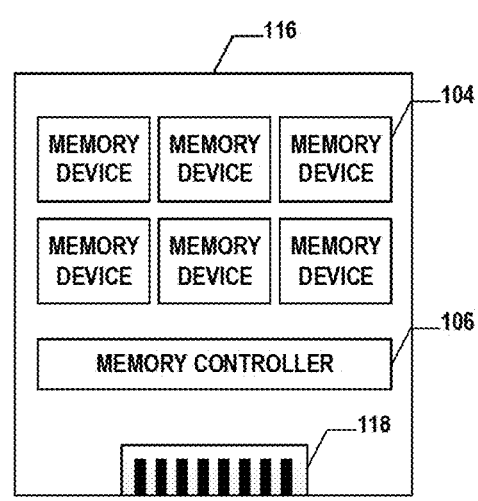
FIG. 1B
FIG. 1C

PAGE BUFFER CIRCUITS IN THREE-DIMENSIONAL MEMORY DEVICES

CROSS-REFERENCE TO RELATED APPLICATIONS

This application is a continuation of U.S. application Ser. No. 17/687,264, filed on Mar. 4, 2022, which is a continuation of International Application No. PCT/CN2021/102987, filed on Jun. 29, 2021, both of which are incorporated herein by reference in their entireties.

TECHNICAL FIELD

The present disclosure generally relates to the field of semiconductor technology, and more particularly, to page buffer circuits in a three-dimensional (3D) memory.

BACKGROUND

As memory devices are shrinking to smaller die sizes to reduce manufacturing cost and increase storage density, scaling of planar memory cells faces challenges due to process technology limitations and reliability issues. A three-dimensional (3D) memory architecture can address the density and performance limitation in planar memory cells. In a 3D NAND memory, one chip can comprise multiple dies that can independently perform NAND operations such as read, write, and erase. Each die can comprise multiple memory planes, and each memory plane can comprise multiple blocks each including multiple memory cells vertically stacked to increase storage capacity per unit area, where memory cells can be addressed from a shared word line. A page buffer circuit can be arranged for each bit line to perform sensing operation and data transfer operation.

BRIEF SUMMARY

Embodiments of a three-dimensional (3D) memory device are described in the present disclosure.

One aspect of the present disclosure provides a page buffer circuit of a memory device, comprising: a first bit line segment sensing branch connected to a first bit line segment and including a low-voltage latch; and a second bit line segment sensing branch connected to a second bit line segment and including a sensing latch; wherein the first bit line segment sensing branch and the second bit line segment sensing branch are parallel connected to a sensing node of the page buffer circuit.

In some embodiments, each of the first and second bit line segment sensing branches comprises a bit line pre-charge path.

In some embodiments, the first bit line segment is aligned with the second bit line segment along a bit line direction.

In some embodiments, the first bit line segment and the second bit line segment are separated connected with a same memory cell string.

In some embodiments, the memory device is a three-dimensional NAND memory device and the memory cell string is a vertical memory cell stack string.

In some embodiments, the first and second bit line segment sensing branches are commonly connected to a cache latch.

In some embodiments, the page buffer circuit further comprises: a third bit line segment sensing branch connected to a third bit line segment and including a sense latch; wherein the first, the second, and the third bit line segment sensing branches are parallel connected to the sensing node of the page buffer circuit.

In some embodiments, the first, second and third bit line segments are aligned with each other along the bit line direction.

In some embodiments, the first, the second, and the third bit line segments are separated connected with a same memory cell string.

In some embodiments, the first, second and third bit line segment sensing branches are commonly connected to a cache latch.

Another aspect of the present disclosure provides a memory device, comprising: a plurality of bit lines parallel extending along a bit line direction, each bit line comprises at least two bit line segments; and a plurality of page buffers each corresponding to one of the plurality of bit lines; wherein the least two bit line segments of each bit line are commonly connected to a same corresponding page buffer.

In some embodiments, each page buffer comprises: a first bit line segment sensing branch connected to a first bit line segment and including a low-voltage latch; and a second bit line segment sensing branch connected to a second bit line segment and including a sense latch; wherein the first bit line segment sensing branch and the second bit line segment sensing branch are parallel connected to a sensing node of the page buffer circuit.

Another aspect of the present disclosure provides a method of performing a read operation by a memory device, comprising: simultaneously perform pre-charge operations, develop operations, and sensing operations, by at least two bit line segment sensing branch in a page buffer circuit, to at least two bit line segments that are aligned with each other along a bit line direction; wherein the least two bit line segments are respectively connected to the at least two bit line segment sensing branch in the same page buffer circuit.

Another aspect of the present disclosure provides a memory system, comprising: a memory device, comprising: a plurality of bit lines parallel extending along a bit line direction, each bit line comprises at least two bit line segments, and a plurality of page buffers each corresponding to one of the plurality of bit lines; wherein the least two bit line segments of each bit line are commonly connected to a same corresponding page buffer; and a memory controller configured to simultaneously perform pre-charge operations, develop operations, and sensing operations, by at least two bit line segment sensing branch in one page buffer circuit, to the at least two bit line segments of one corresponding bit line.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1B illustrates a diagram of an exemplary memory card having a memory device, in accordance with some embodiments.

FIG. 1C illustrates a diagram of an exemplary solid-state drive (SSD) having a memory in accordance with some embodiments.

Figure 1A:
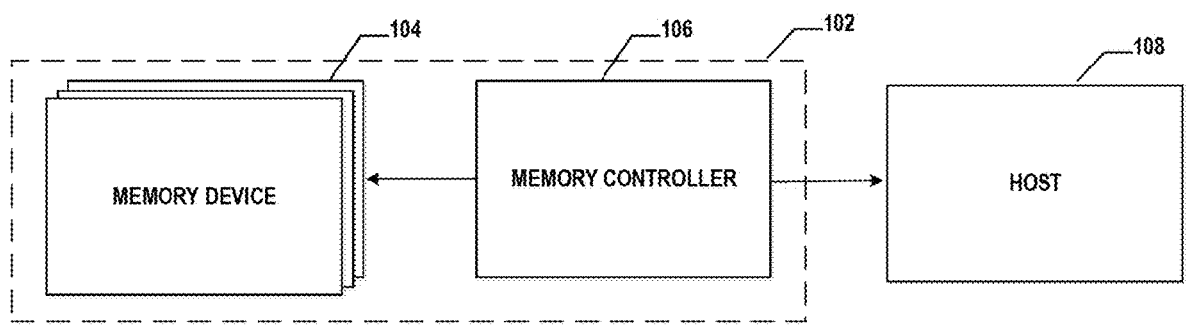
FIG. 1A illustrates a block diagram of an exemplary system having a memory device, in accordance with some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The front surface of the substrate is typically where a semiconductor device is formed, and therefore the semiconductor device is formed at a top side of the substrate unless stated otherwise. The bottom surface is opposite to the front surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1A illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1A, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a NAND Flash memory device. Consistent with the scope of the present disclosure, memory controller 106 may control the multi-pass programming on memory device 104 such that an NGS operation is enabled on all memory cells, even those passed the respective verify operations, in a non-last programming pass of the multi-pass programming. The peripheral circuits, such as the word line drivers, may apply a low voltage, e.g., ground (GND) voltage, on the DSGs of each memory string coupled to the selected word line, and may apply a low or negative voltage on the selected word line to enable an NGS operation on all memory cells coupled to the selected word line during a non-last programming pass.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, programming memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 1B, memory controller 106 and a single memory device 104 may be integrated into a memory card 112. Memory card 112 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 112 can further include a memory card connector 114 coupling memory card 112 with a host (e.g., host 108 in FIG. 1A). In another example as shown in FIG. 1C, memory controller 106 and multiple memory devices 104 may be integrated into an SSD 116. SSD 116 can further include an SSD connector 118 coupling SSD 116 with a host (e.g., host 108 in FIG. 1A). In some implementations, the storage capacity and/or the operation speed of SSD 116 is greater than those of memory card 112.

Figure 2:
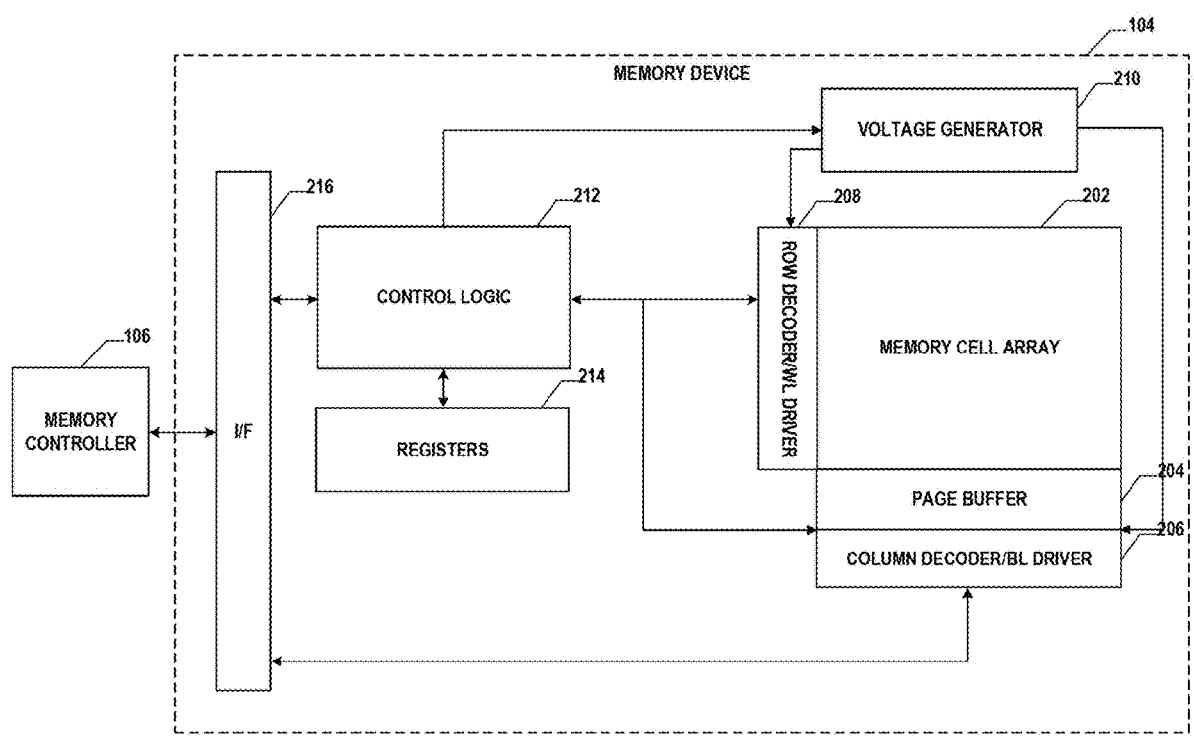
FIG. 2 illustrates a schematic block diagram of an example hardware module configuration of a memory system, in accordance with some embodiments.
Figure 3:
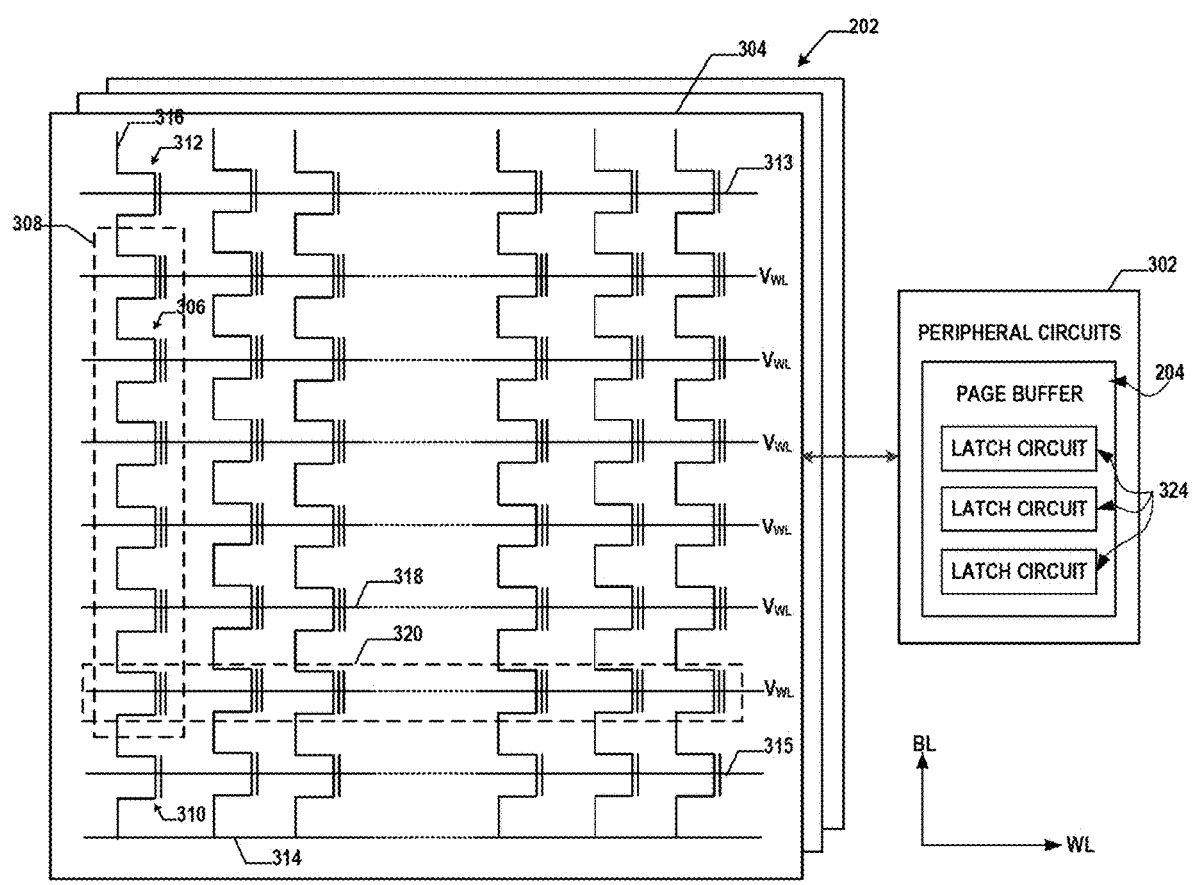
FIG. 3 illustrates a schematic circuit diagram of an exemplary memory device including peripheral circuits, according to some aspects of the present disclosure.

FIG. 2 illustrates a diagram of an exemplary memory device 104, e.g., a NAND Flash memory, having a memory cell array 202 and peripheral circuits including a page buffer 204, a column decoder/bit line driver 206, a row decoder/word line driver 208, a voltage generator 210, control logic 212, registers 214, and an interface 216. FIG. 3 illustrates a schematic circuit diagram of an exemplary memory device 104 including a memory cell array 202 and peripheral circuits 302 coupled to memory cell array 202. For ease of illustration, some components in FIGS. 2 and 3 are described together. Peripheral circuits 302 can include page buffer 204, column decoder/bit line driver 206, row decoder/word line driver 208, voltage generator 210, control logic 212, registers 214, and interface 216 in FIG. 2. It is understood that in some examples, additional peripheral circuits may be included as well.

In some embodiments, the voltage generator 210 can include a plurality of charge pumps and linear regulators. In some embodiments, the memory cell array can include multiple planes. In some embodiments, a NAND die may be divided into four planes (i.e., plane 0, plane 1, plane 2, and plane 3), or fewer or more than four planes (e.g., 1, 2, 6, 8, etc.). A plane includes multiple memory cells which may be grouped into memory blocks. A memory block is typically the smallest erasable entity in a NAND flash die. In one example, a memory block includes a number of cells that are coupled to the same bit line. A memory block includes one or multiple pages of cells. The size of the page can vary depending on implementation. In one example, a page has a size of 16 kB. Page sizes of less or more than 16 kB are also possible (e.g., 512 B, 2 kB, 4 kB, etc.).

In some embodiments, the row decoder/word line driver 208 can select one of the memory blocks in the memory cell array 202 in response to an address (ADD). The row decoder/word line driver 208 can select one of the word lines of the selected memory block in response to the address ADD. The row decoder/word line driver 208 can transmit a voltage corresponding to an operating mode to a word line of the selected memory block. During a program operation, the row decoder/word line driver 208 can transmit a program voltage and a verification voltage to a selected word line and a pass voltage to an unselected word line. During a read operation, the row decoder/word line driver 208 can transmit a selection read voltage to the selected word line and a non-selection read voltage to the unselected word line.

NAND memory devices are capable of performing a read operation on one plane at a time. Such NAND memory devices have a single state machine for the whole die. If a read is being serviced on one plane, the other planes are idle. Therefore, such reads (called single plane reads) do not utilize all the planes at the same time. The lack of concurrency leads to high latency due to, for example, reads getting "stuck" behind other reads.

Another type of operation is a multi-plane operation (e.g., a quad plane read that performs a read on four planes at once). With multi-plane operations, there are multiple restrictions on the commands. For array commands, the array operation has to be the same (e.g., program, erase, or, read, but not a combination) and also the page type for those array operations has to be same. The voltage biasing to access different page types (e.g., lower page, upper page, etc.) is different, and the single state machine on the die applies the same voltage bias for all the planes. With random workloads, this requirement is hard to meet for read commands. The likelihood of receiving reads for the same page type on all four planes is low for a random workload. Therefore, the improvement in read latency with a quad plane read is minimal for a random workload. Accordingly, this feature is not typically utilized for random read workloads, which is typically considered to be a key workload for SSDs (solid state drives).

Another solution attempted was to combine reads of different page types on different planes into a single command. However, all those reads are handled as a single command by the NAND, which means there is single start and completion for the reads. Therefore, with such a technique the read duration is dominated by the worst (e.g., slowest) page type and asynchronous reads are not possible. Accordingly, combining different page types on different planes into a single command also results in minimal increases in performance and Quality of Service (QoS).

In contrast to conventional NAND operations, independent multi-plane operations enable independent and concurrent operations per plane. Separate state machines for each plane enable application of different bias voltages for each plane to independently and concurrently service requests. All NAND array commands are allowed independently on the plane level, enabling significant performance improvements. An array command is a command that causes an array operation, such as programming data to the array, reading data from the array, erasing a block, or other operations on the array.

In one example, each plane can receive and service a different array command (e.g., read command, program command, erase command, etc.), and the commands can be sent and completed at different times. Non-array commands (e.g., reset command, timing mode change command, etc.) can be maintained as die-level commands. In an alternative example, read operations are allowed independently on the plane level. Other operations, such as program command and erase command, are die-level operations. Further, some supporting commands for read, such as read status and read column enhanced may also be plane-level commands.

As shown in FIG. 3, memory cell array 202 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor. In one example, the memory cell 306 includes a transistor with a replacement gate. A memory cell 306 with a replacement gate typically has a low resistance gate (e.g., a tungsten gate) and a charge trap layer between the gate and the channel where charge is trapped or stored to represent one or more bit values. In another example, a memory cell 306 can include a transistor with a floating gate (e.g., a high resistance poly gate) that stores charge indicative of one or more bit values. Other architectures are also possible.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can include a source select gate (SSG) 310 at its source end and a drain select gate (DSG) 312 at its drain end. SSG 310 and DSG 312 are respective the gate electrodes of an SSG transistor and a DSG transistor and can be configured to activate selected NAND memory strings 308 (columns of the array) during read and program operations. In some implementations, SSGs 310 of NAND memory strings 308 in the same block 304 are coupled through a same source line (SL) 314, e.g., a common SL, for example, to the ground. DSG 312 of each NAND memory string 308 is coupled to a respective bit line 316 from which data can be read via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can correspond to the number of NAND memory strings 308 coupled by word line 318 in one block 304. Each word line 318 can include a plurality of control gates (gate electrodes) at each memory cell 306 in respective no user data, can also be used in the memory array adjacent to the select gate transistors. Such dummy word lines can shield the edge data word line from certain edge effects.

Peripheral circuits 302 can be coupled to memory cell array 202 through bit lines 316, word lines 318, source lines 314, SSG lines 315, and DSG lines 313. Peripheral circuits 302 may apply voltages on bit lines 316, word lines 318, source lines 314, SSG lines 315, and DSG lines 313 to perform multi-pass programming including the proposed NGS scheme in a non-last programming pass. As described above, peripheral circuits 302 can include any suitable circuits for facilitating the operations of memory cell array 202 by applying and sensing voltage signals and/or current signals through bit lines 316 to and from each target memory cell 306 through word lines 318, source lines 314, SSG lines 315, and DSG lines 313. Peripheral circuits 302 can include various types of peripheral circuits formed using MOS technologies.

In some embodiments, peripheral circuits 302 can include page buffer 204 as shown in FIG. 2. Page buffer 204 is connected to the memory cell array 202 through bit lines 316 and configured to store sensing data of memory cell array 202 in a sensing operation. Page buffer 204 can include a plurality of latch circuits 324 respectively configured to sense data from selected memory cells among the memory cells 306 through the bit lines 316. The latch circuits 324 respectively are configured to perform a plurality of read operations to determine one data state. The latch circuits 324 are respectively configured to store results of the read operations. Page buffer 204 is controlled by control logic 202 such that the latch circuits 324 sequentially and respectively store the results of the read operations, to compare data stored in the latch circuits with each other, and to select one latch circuit among the latch circuits 324 based on the comparison result.

A programming sequence for a group of memory cells 306 can include programming of all of the intended pages into the group of memory cells 306. A programming sequence can include one or more programming passes. A programming pass (which can include one or more programming loops) can program one or more pages. A programming pass can include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming) The application of an effective program voltage to a cell can include changing the voltage difference between a control gate and a channel of the cell in order to change the threshold voltage of the cell. Accordingly, a voltage of a word line (coupled to the control gate of the target cell) and/or a channel of the cell can be set in order to effectuate application of an effective program voltage. As a program voltage is commonly used to refer to a voltage applied to a word line, the effective program voltage can be the voltage difference between a control gate and channel of a cell (which in instances where the channel is held at OV can be synonymous with a program voltage).

Figure 4A:
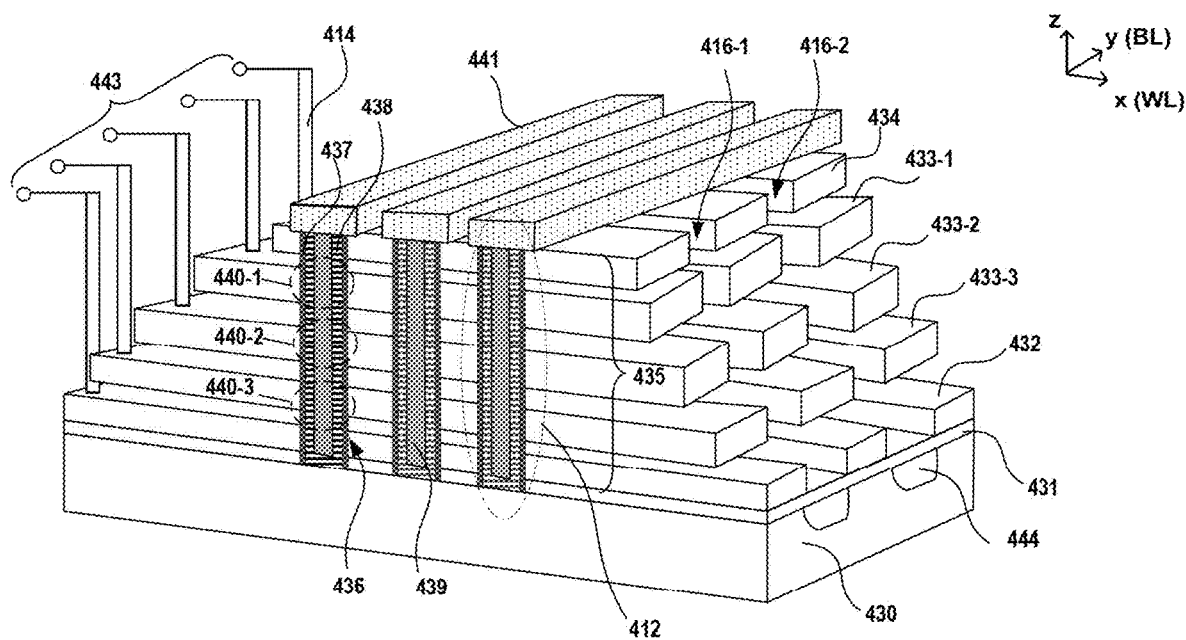
FIG. 4A illustrates a perspective view of a portion of an exemplary three-dimensional (3D) memory array structure, in accordance with some embodiments.

FIG. 4A illustrates a perspective view of a portion of an exemplary three-dimensional (3D) memory cell array structure 400, according to some embodiments. The memory cell array structure 400 includes a substrate 430, an insulating film 431 over the substrate 430, a tier of bottom select gates (BSGs) 432 over the insulating film 431, and a plurality of tiers of control gates 433, also referred to as "word lines" (WLs) stacking on top of the BSGs 432 to form a film stack 435 of alternating conductive and dielectric layers. The dielectric layers adjacent to the tiers of control gates are not shown in FIG. 4 for clarity.

The control gates of each tier are separated by slit structures 416-1 and 416-2 through the film stack 435. The memory cell array structure 400 also includes a tier of top select gates (TSGs) 434 over the stack of control gates 433. The stack of TSGs 434, control gates 4133 and BSGs 432 is also referred to as "gate electrodes." The memory cell array structure 400 further includes memory strings 412 and doped source line regions 444 in portions of substrate 430 between adjacent BSGs 432. Each memory strings 412 includes a channel hole 436 extending through the insulating film 431 and the film stack 435 of alternating conductive and dielectric layers. Memory strings 412 also includes a memory film 437 on a sidewall of the channel hole 436, a channel layer 438 over the memory film 437, and a core filling film 439 surrounded by the channel layer 438. A memory cell 440 can be formed at the intersection of the control gate 433 and the memory string 412. A portion of the channel layer 438 underneath the control gate 433 is also referred to as the channel of the memory cell 440. The memory cell array structure 400 further includes a plurality of bit lines (BLs) 441 connected with the memory strings 412 over the TSGs 434. The memory cell array structure 400 also includes a plurality of metal interconnect lines 443 connected with the gate electrodes through a plurality of contact structures 414. The edge of the film stack 435 is configured in the shape of staircase to allow an electrical connection to each tier of the gate electrodes.

In FIG. 4A, for illustrative purposes, three tiers of control gates 433-1, 433-2, and 433-3 are shown together with one tier of TSG 434 and one tier of BSG 432. In this example, each memory string 412 can include three memory cells 440-1, 440-2 and 440-3, corresponding to the control gates 433-1, 433-2 and 433-3, respectively. The number of control gates and the number of memory cells can be more than three to increase storage capacity. The memory cell array structure 400 can also include other structures, for example, TSG cut structures, common source contacts and dummy memory strings, etc. These structures are not shown in FIG. 4A for simplicity.

Figure 4B:
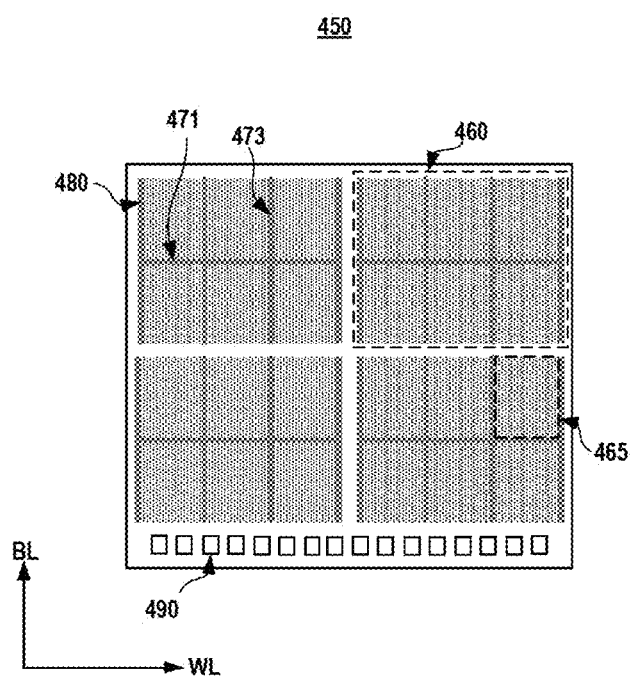
FIG. 4B illustrates a schematic diagram of an exemplary 3D memory device in a plan view, in accordance with some embodiments.

FIG. 4B illustrates a schematic diagram of an exemplary 3D memory device 450 in the plan view, according to some embodiments of the present disclosure. 3D memory device 450 can include a plurality of channel structure regions, such as memory planes, memory blocks, memory fingers, etc., and one or more through array contact (TAC) structures can be formed between two neighboring channel structure regions. In some embodiments as shown in FIG. 4B, 3D memory device 450 can include four or more memory planes 460, each of which can include a plurality of memory blocks 465. It is noted that, the arrangement of memory planes 460 in 3D memory device 450 and the arrangement of memory blocks 465 in each memory plane 460 illustrated in FIG. 4B are only used as an example, which is not limit the scope of the present disclosure.

TAC structures can include one or more bit line (BL) TAC regions 471 that are sandwiched by two neighboring memory blocks 465 in the bit line direction of the 3D memory device (labeled as "BL" in figures) and extended along the word line direction of the 3D memory device (labeled as "WL" in figures), one or more word line (BL) TAC regions 473 that are sandwiched by two neighboring memory blocks 465 in the word line direction (WL) and extended along the bit line direction (BL), and one or more staircase structure (SS) TAC regions 480 that are located at the edges of each memory plane 460.

In some embodiments, 3D memory device 450 can include a plurality of contact pads 490 arranged in a line at an edge of the 3D memory device 450. Interconnect contact can be used for electrically interconnect 3D memory device 450 to any suitable device and/or interface that provide driving power, receive control signal, transmit response signal, etc.

Figure 5:
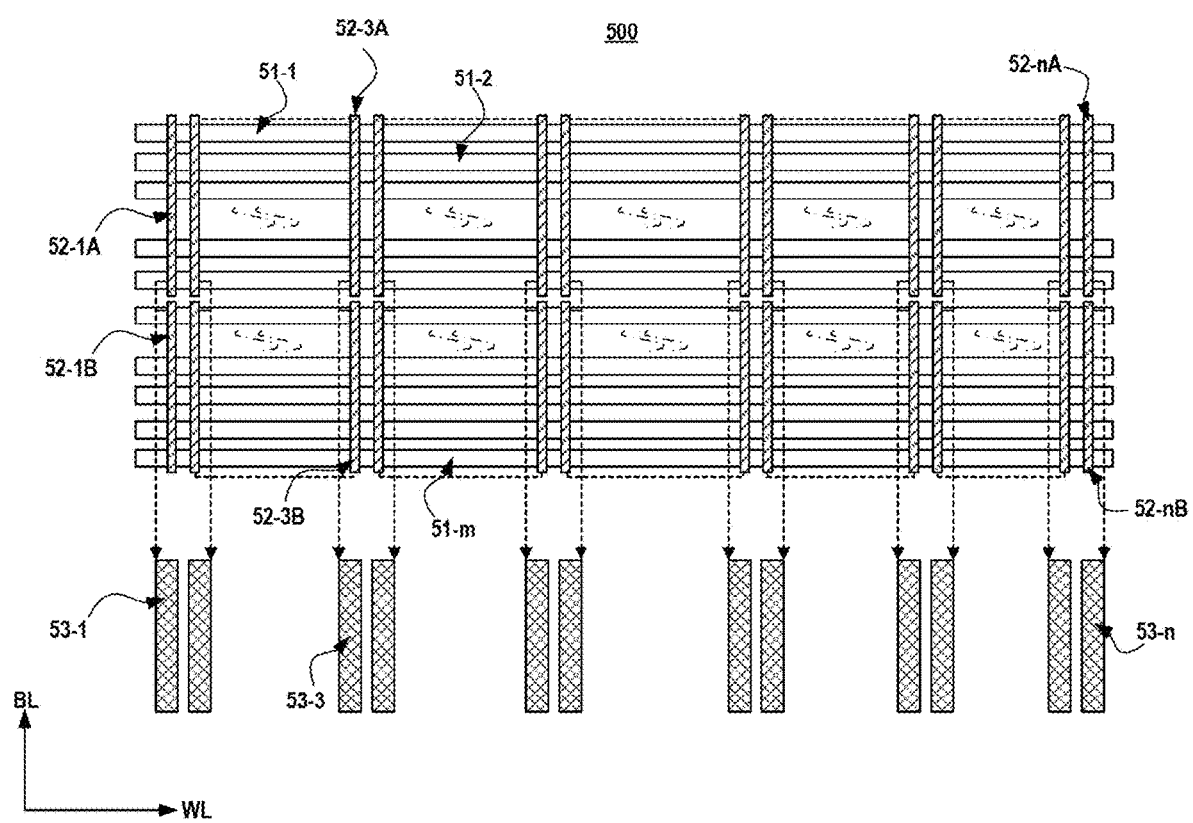
FIG. 5 illustrates a schematic diagram of an example memory block and corresponding page buffers of a 3D NAND device, in accordance with some embodiments.

FIG. 5 illustrates a schematic diagram of an example memory block and corresponding page buffers of a 3D NAND device, according to some embodiments.

As shown in FIG. 5, in each memory block 500, a plurality of word lines 51-1 to 51-$m$ extending in the word line (WL) direction can be arranged parallel with each other to distribute along the bit line (BL) direction. Each of the plurality of word lines 51-1 to 51-$m$ can be connected a corresponding row of memory cells 306 of adjacent NAND memory strings 308 (referring to FIG. 3).

Each memory block 500 can further include a plurality of bit lines (e.g., 52-1 to 52-$n$) extending in the BL direction and being arranged parallel with each other to distribute along the WL direction. Along the BL direction, each NAND memory string (e.g., NAND memory string 308 as referred to FIG. 3 described above) can be coupled to two or more bit line segments (e.g., 52-1A and 52-1B, 52-3A and 52-3B, 52-$n$A and 52-$n$B, etc.) that are not directly connected with each other. It is noted that, FIG. 5 illustrates one example embodiments that each bit line of a corresponding NAND memory string includes two bit line segments. In some other embodiments, each bit line can include more than two bit line segments that are not directly connected with each other. The bit line segments corresponding to a some NAND memory string can be connected to a corresponding page buffer. For example as shown in FIG. 5, bit line segments 52-1A and 52-1B are commonly connected to page buffer 53-1, bit line segments 52-3A and 52-3B are commonly connected to page buffer 53-3, and bit line segments 52-$n$A and 52-$n$B are commonly connected to page buffer 53-$n$.

As described above, page buffers 53-1 to 53-$n$ can operate as a write driver or a sense amplifier to perform a sensing operation ("SO", also referred as "sensing output") multiple times to select and output data among data included in the sensed results to determine a specific data state in a device, and to perform read operations with respect to the selected memory cells during different develop periods. Specifically, during a program operation, each page buffer can transmit a bit line voltage corresponding to data to be programmed to corresponding bit line segments of the memory cell array. During a read operation or a sensing operation, each page buffer can sense data stored in a selected memory cell through the corresponding bit line segments.

It is noted that, in some existing designs, each NAND memory string corresponds to one bit line which is not divided into two or more bit line segments as shown in FIG. 5. In such existing designs, one block of data is used as one unit in the program operation or read operation, which means each operation is executed to read data one block by one block. In order to read multiple blocks of data simultaneously to save operation time, in some other existing designs, each bit line can be divided into two or more bit line segments, and each bit line segment is connected to a separate buffer page. However, such existing designs increase the number of page buffers thereby increasing the chip area.

Different from the existing designs, the present disclosure provides page buffers 53-1 to 53-$n$ each corresponding to two or more bit line segments. Each of the page buffers 53-1 to 53-$n$ can respectively read two or more blocks of data at the same time. That is, to determine the data state of one stored in memory cells selected according to control of the control logic 202, each of the page buffers 53-1 to 53-$n$ can perform a plurality of sensing operations simultaneously.

Figure 6A:
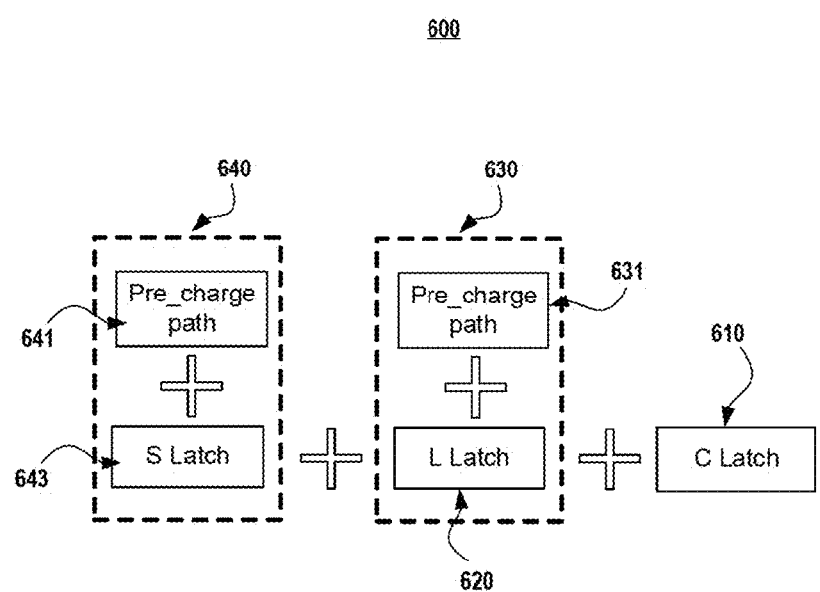
FIG. 6A illustrates a schematic block diagram of an example page buffer of a 3D NAND device, in accordance with some embodiments.
Figure 6B:
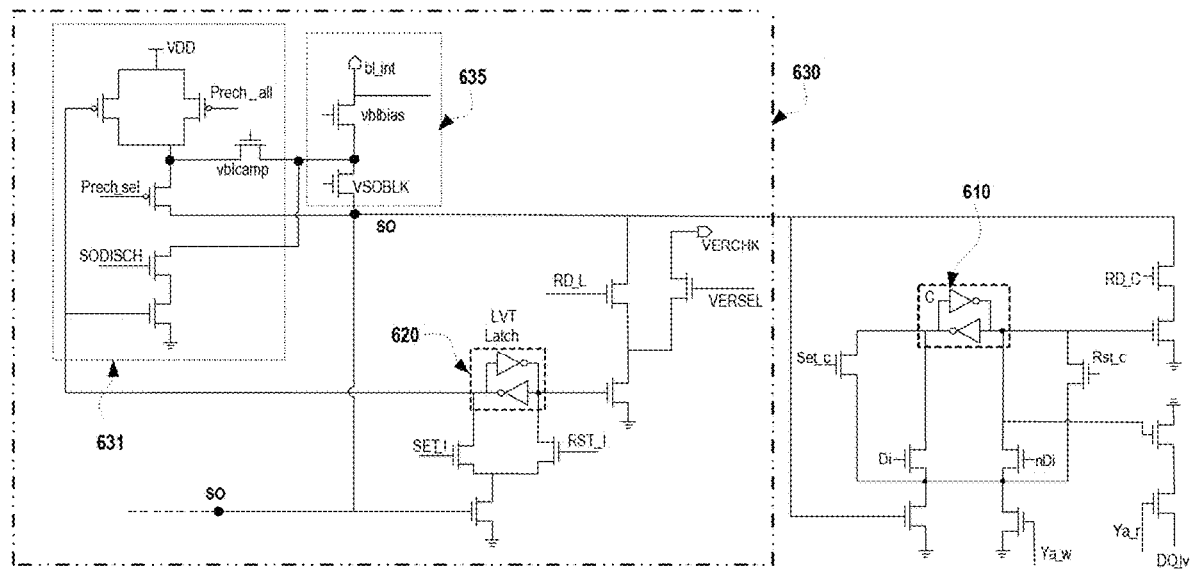
FIGS. 6B-6C illustrate schematic logic circuit diagrams of an example page buffer of a 3D NAND device, in accordance with some embodiments.
Figure 6C:
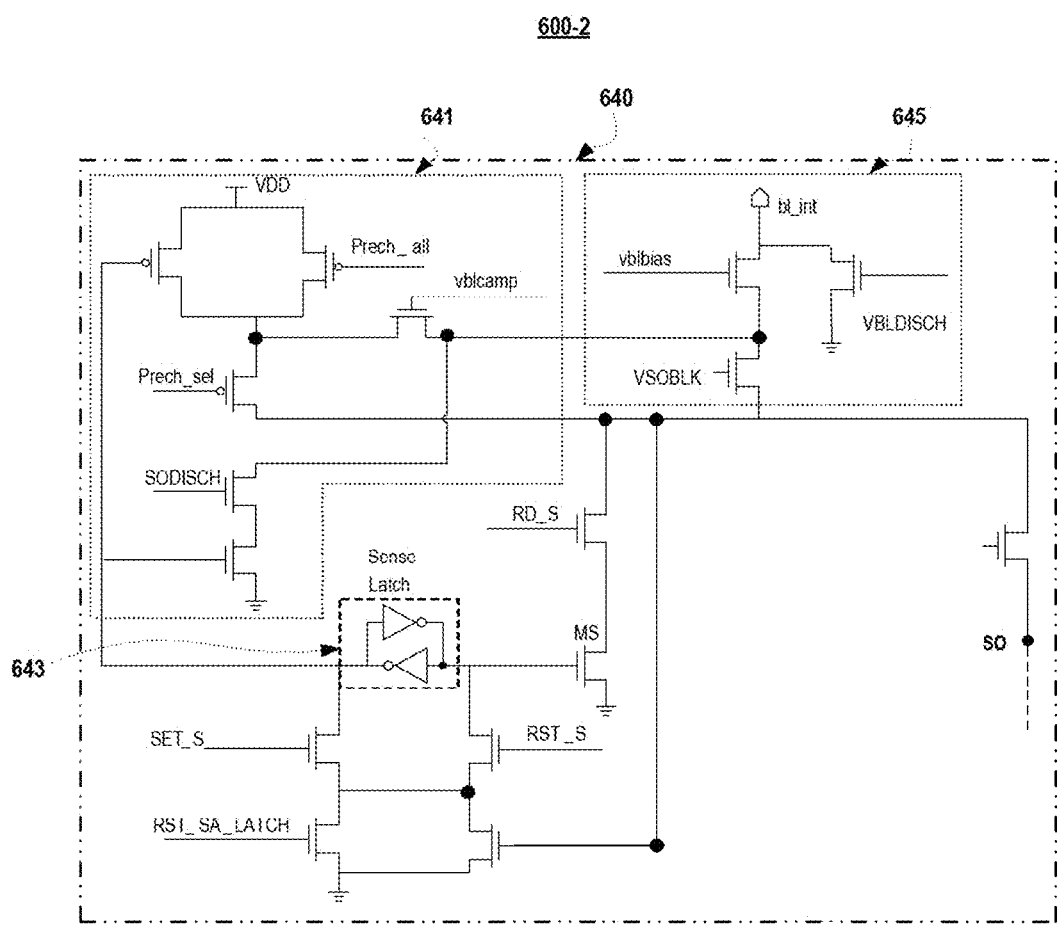

FIG. 6A illustrates a schematic block diagram of an example page buffer of a 3D NAND device, according to some embodiments. FIGS. 6B and 6C illustrates schematic logic circuit diagrams of an example page buffer of a 3D NAND device, according to some embodiments.

As shown in FIG. 6A, page buffer 600 can include a cache latch (C Latch) 610 and at least two bit line segment sensing branches 630, 640 in parallel connection with the C Latch 610. Each of the two bit line segment sensing branches 630 and 640 can be respectively connected to a corresponding bit line segment (e.g., 52-1A, 52-1B, etc., as shown in FIG. 5). In some embodiments, the at least two bit line segment sensing branches can comprise a first bit line segment sensing branch 630 and at least one second bit line segment sensing branch 640. The first bit line segment sensing branch 630 can include a low-voltage latch (L Latch) 620 and a bit line pre-charge path 631. Each second bit line segment sensing branch 640 can include a sense latch (S Latch) 643) and a bit line pre-charge path 641. In some other embodiments not shown in FIG. 6A, when a page buffer is coupled to more than two bit line segments, the page buffer can include more than two bit line segment sensing branches in parallel connection with the C Latch 610 while each bit line segment sensing branch corresponds to a separate bit line segment.

As shown in FIGS. 6B and 6C, detailed circuit diagrams of an exemplary page buffer 600 are shown. It is noted that, the first portion of page buffer circuit 600-1 is connected to the second portion of page buffer circuit 600-2 through the sensing node SO.

Referring to FIG. 6B, the first bit line segment sensing branch 630 can include a bit line pre-charge path 631 configured to precharge the corresponding bit line segment. The first bit line segment sensing branch 630 can further include an L Latch 620 configured to generate program voltage and cache data, and also configured as a portion of one sensing branch, such as used as a sensing latch to sense the develop state of the sensing node SO. The first bit line segment sensing branch 630 can further include a bit line voltage supply and selection circuit 635 configured to supply the bit line voltage to the corresponding bit line segment and select the corresponding bit line segment of the programming and reading operations. It is noted that, one or more extra latch circuits (not shown) can be connected between C Latch 610 and L Latch 620.

Referring to FIG. 6C, the second bit line segment sensing branch 640 is connected to the sensing node SO through a switch. The second bit line segment sensing branch 640 can include a bit line pre-charge path 641 configured to precharge the corresponding bit line segment. The second bit line segment sensing branch 640 can further include a S Latch 643 configured to sense the develop state of the sensing node SO. The second bit line segment sensing branch 640 can further include a bit line voltage supply and selection circuit 645 configured to supply the bit line voltage to the corresponding bit line segment and select the corresponding bit line segment of the programming and reading operations.

Figure 7:
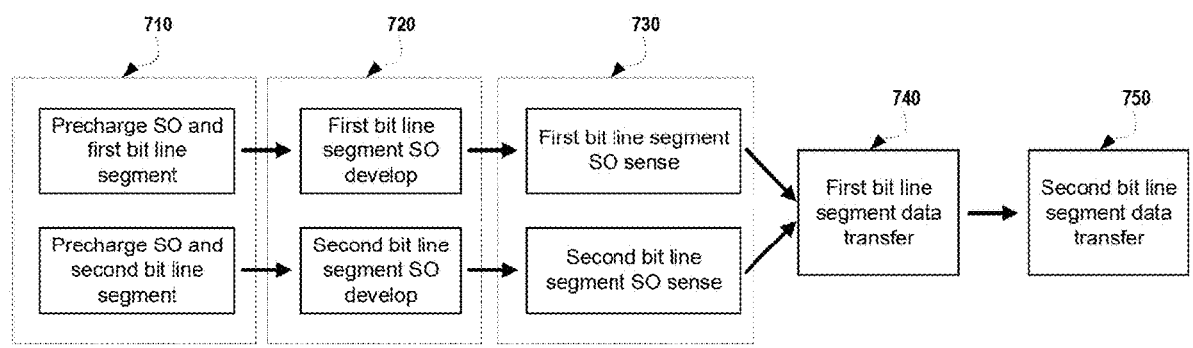
FIG. 7 illustrates a schematic block diagram of an example page buffer operation timing sequence of a read operation, in accordance with some embodiments.

Referring to FIG. 7, a schematic block diagram of an example page buffer operation timing sequence of a read operation is illustrated according to some embodiments. Since the first bit line segment sensing branch 630 and the second bit line segment sensing branch 640 are parallel connected to the sensing node SO, the precharge operation, SO develop operation, and SO sense operation of two bit line segments can be performed in parallel.

As shown in FIG. 7, during first time period 710, a precharge operation may be performed by the page buffer to simultaneously precharge SO and the first and second bit line segments. For example, the first and second bit line segments 52-1A, 52-1B and sensing node SO respectively connected with the two parallel bit line pre-charge paths 631, 641 in page buffer 53-1 can be precharged to a specific level simultaneously during first time period 710.

Similarly, during the second time period (develop time) 720 and the third time period (sensing time) 730, a develop operation and a sensing operation may be performed by the page buffer to the first and second bit line segments simultaneously. For example, through each bit line segment connection, a voltage of the sensing node SO can be controlled based on a corresponding bit line segment connection control signal and a sensing node voltage control signal during the second time period (develop time) 720. Further, the page buffer can determine logic levels of the sensing nodes SO to store sensing data at two parallel L Latch 620 and S Latch 634 provided by sensing a level of the voltage of the sensing node SO during the third time period (sensing time) 730.

Since the parallel first and second bit line segment sensing branches 630 and 640 share a common C Latch 610, the cache function for two bit line segments are performed in a sequentially basis. For example, during the fourth time period 740, the stored data from the first bit lines segment can be transferred from the L Latch 620 to the C Latch 610 for subsequent output. After the data transfer is completed for the first bit lines segment, during the fifth time period 750, the stored data from the second bit lines segment can be transferred from the S Latch 643 to the C Latch 610 for subsequent output.

It is noted that, in some embodiments, the time periods 710, 720 and 730 for each bit line segments may not be the same. For example, the precharge operation of one of the first and second bit line segments may be completed earlier than the precharge operation of other bit line segment. In such case, one approach is that the develop operations of the first and second bit line segments can be started at the same time after both of the precharge operation of one of the first and second bit line segments are completed, and the sensing operations of the first and second bit line segments can be started at the same time after both of the develop operation of one of the first and second bit line segments are completed. Another approach is that the develop operation of one bit line segment can be started right after the precharge operation of the bit line segments is completed. Similarly, the sensing operation of one bit line segment can be started right after the develop operation of the bit line segments is completed. The one bit line segment firstly finishes the sensing operation can directly go to the data transfer operation. Both approaches allows performing the precharge, develop and sensing operations of different bit line segments at the same time in a time parallel basis.

It is noted that, the above descriptions in connected with FIGS. 5, 6A-6C and 7 are based on an exemplary page buffer comprising two parallel bit line segment sensing branches. In some other embodiments, a bit line can be split into three or more bit line segments that share a page buffer including three or more parallel bit line segment sensing branches. Each of the three or more parallel bit line segment sensing branches can be connected to the sensing node SO to independently perform the precharge operation, develop operation, and sensing operation for corresponding bit line segments. One of the three or more parallel bit line segment sensing branches can include an L Latch to sense the SO level, while other of the three or more parallel bit line segment sensing branches can include an S Latch to sense the SO level.

Accordingly, the present disclosure provides page buffer circuits of 3D NAND devices that allow two or more sensing operations for two or more bit line segments at the same time by using a same control signal and without increasing the number of page buffers. Therefore, the read speed of the 3D NAND devices can be increased without increasing the number of MOSs in the periphery circuit, thereby improving the product performance while keeping the compact size of the 3D NAND devices. Further, an L Latch in the page buffer is used as a sensing latch to sense the SO level of one bit line segment. Thus, the latch number can be further reduced to save chip area without effecting other operations, such as program operation.

One aspect of the present disclosure provides a page buffer circuit of a memory device, comprising: a first bit line segment sensing branch connected to a first bit line segment and including a low-voltage latch; and a second bit line segment sensing branch connected to a second bit line segment and including a sensing latch; wherein the first bit line segment sensing branch and the second bit line segment sensing branch are parallel connected to a sensing node of the page buffer circuit.

In some embodiments, each of the first and second bit line segment sensing branches comprises a bit line pre-charge path.

In some embodiments, the first bit line segment is aligned with the second bit line segment along a bit line direction.

In some embodiments, the first bit line segment and the second bit line segment are separated connected with a same memory cell string.

In some embodiments, the memory device is a three-dimensional NAND memory device and the memory cell string is a vertical memory cell stack string.

In some embodiments, the first and second bit line segment sensing branches are commonly connected to a cache latch.

In some embodiments, the page buffer circuit further comprises: a third bit line segment sensing branch connected to a third bit line segment and including a sense latch; wherein the first, the second, and the third bit line segment sensing branches are parallel connected to the sensing node of the page buffer circuit.

In some embodiments, the first, second and third bit line segments are aligned with each other along the bit line direction.

In some embodiments, the first, the second, and the third bit line segments are separated connected with a same memory cell string.

In some embodiments, the first, second and third bit line segment sensing branches are commonly connected to a cache latch.

Another aspect of the present disclosure provides a memory device, comprising: a plurality of bit lines parallel extending along a bit line direction, each bit line comprises at least two bit line segments; and a plurality of page buffers each corresponding to one of the plurality of bit lines; wherein the least two bit line segments of each bit line are commonly connected to a same corresponding page buffer.

In some embodiments, each page buffer comprises: a first bit line segment sensing branch connected to a first bit line segment and including a low-voltage latch; and a second bit line segment sensing branch connected to a second bit line segment and including a sense latch; wherein the first bit line segment sensing branch and the second bit line segment sensing branch are parallel connected to a sensing node of the page buffer circuit.

Another aspect of the present disclosure provides a method of performing a read operation by a memory device, comprising: simultaneously perform pre-charge operations, develop operations, and sensing operations, by at least two bit line segment sensing branch in a page buffer circuit, to at least two bit line segments that are aligned with each other along a bit line direction; wherein the least two bit line segments are respectively connected to the at least two bit line segment sensing branch in the same page buffer circuit.

Another aspect of the present disclosure provides a memory system, comprising: a memory device, comprising: a plurality of bit lines parallel extending along a bit line direction, each bit line comprises at least two bit line segments, and a plurality of page buffers each corresponding to one of the plurality of bit lines; wherein the least two bit line segments of each bit line are commonly connected to a same corresponding page buffer; and a memory controller configured to simultaneously perform pre-charge operations, develop operations, and sensing operations, by at least two bit line segment sensing branch in one page buffer circuit, to the at least two bit line segments of one corresponding bit line.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A page buffer circuit of a memory device, comprising:
   a first sensing branch comprising a first pre-charge path and a low-voltage latch; and
   a second sensing branch comprising a second pre-charge path and a sensing latch,
   wherein the first sensing branch and the second sensing branch are parallel coupled to a sensing node of the page buffer circuit.

2. The page buffer circuit of claim 1, wherein the second sensing branch is coupled to the sensing node through a switch.

3. The page buffer circuit of claim 2, wherein the second pre-charge path is coupled to the sensing node through the switch.

4. The page buffer circuit of claim 2, wherein the sensing latch is coupled to the sensing node through the switch.

5. The page buffer circuit of claim 1, wherein a first circuit configuration of the first pre-charge path is the same as a second circuit configuration of the second pre-charge path.

6. The page buffer circuit of claim 1, wherein
   the first pre-charge path further comprises a first bit line voltage supply and selection circuit; and
   the second pre-charge path further comprises a second bit line voltage supply and selection circuit.

7. The page buffer circuit of claim 6, wherein the first bit line voltage supply and selection circuit are coupled to the second bit line voltage supply and selection circuit.

8. The page buffer circuit of claim 1, further comprising a cache latch coupled to the sensing node.

9. The page buffer circuit of claim 1, further comprising:
   a third sensing branch, wherein the first, the second, and the third sensing branches are parallel coupled to the sensing node of the page buffer circuit.

10. A memory device, comprising:
bit lines; and
page buffers coupled to the bit lines,
wherein one of the page buffers comprises a first sensing branch comprising a first pre-charge path and a low-voltage latch, and a second sensing branch comprising a second pre-charge path and a sensing latch; and
the first sensing branch and the second sensing branch are parallel coupled to a sensing node of the page buffer.

11. The memory device of claim 10, wherein the second sensing branch is coupled to the sensing node through a switch.

12. The memory device of claim 11, wherein the second pre-charge path is coupled to the sensing node through the switch.

13. The memory device of claim 11, wherein the sensing latch is coupled to the sensing node through the switch.

14. The memory device of claim 10, wherein a first circuit configuration of the first pre-charge path is the same as a second circuit configuration of the second pre-charge path.

15. The memory device of claim 10, wherein
the first pre-charge path further comprises a first bit line voltage supply and selection circuit; and
the second pre-charge path further comprises a second bit line voltage supply and selection circuit.

16. The memory device of claim 15, wherein the first bit line voltage supply and selection circuit are coupled to the second bit line voltage supply and selection circuit.

17. The memory device of claim 10, wherein one of the page buffers further comprises a cache latch coupled to the sensing node.

18. A method for operating a memory device, comprising
performing pre-charge operations, develop operations, and sensing operations respectively, by at least two sensing branch coupled to a sensing node in a page buffer circuit, to at least two bit line segments that are aligned with each other along a bit line direction,
wherein the least two bit line segments are respectively coupled to the at least two sensing branch in the same page buffer circuit.

19. The method of claim 18, further comprising:
pre-charging, by the page buffer circuit, a first and a second bit line segment of the least two bit line segments during a first period; and
pre-charging, by the page buffer circuit, the sensing node during the first period.

20. The method of claim 19, further comprising:
adjusting, by the page buffer circuit, potential of the sensing node during a second period after the first period.

\* \* \* \* \*